(12) United States Patent
Park

(10) Patent No.: US 8,369,095 B2
(45) Date of Patent: Feb. 5, 2013

(54) PROTECTION CIRCUIT BOARD FOR SECONDARY BATTERY AND SECONDARY BATTERY USING THE PROTECTION CIRCUIT BOARD

(75) Inventor: Seokryun Park, Yongin-si (KR)

(73) Assignee: Samsung SDI Co., Ltd., Gongse-dong, Giheung-gu, Yongin-si, Gyeonggi-do (KR)

( * ) Notice: Subject to any disclaimer, the term of this patent is extended or adjusted under 35 U.S.C. 154(b) by 1169 days.

(21) Appl. No.: 12/232,815

(22) Filed: Sep. 24, 2008

(65) Prior Publication Data

US 2009/0087694 A1 Apr. 2, 2009

(30) Foreign Application Priority Data

Sep. 28, 2007 (KR) ........................ 10-2007-0097983

(51) Int. Cl.
*H01M 10/02* (2006.01)
*H05K 1/18* (2006.01)

(52) U.S. Cl. .......................... 361/748; 429/7

(58) Field of Classification Search ....... 429/7; 361/748
See application file for complete search history.

(56) References Cited

U.S. PATENT DOCUMENTS

| | | | |
|---|---|---|---|
| 2005/0106454 A1* | 5/2005 | Kozu et al. | 429/175 |
| 2005/0112456 A1* | 5/2005 | Kozu et al. | 429/62 |
| 2006/0227521 A1 | 10/2006 | Nam et al. | |

FOREIGN PATENT DOCUMENTS

| | | |
|---|---|---|
| JP | 11-003696 A | 1/1999 |
| JP | 2003297315 | 10/2003 |
| JP | 2004303618 | 10/2004 |
| KR | 1020010027806 A | 4/2001 |
| KR | 1020040096433 A | 11/2004 |
| KR | 1020070081306 A | 8/2007 |

\* cited by examiner

*Primary Examiner* — Helen O Conley
(74) *Attorney, Agent, or Firm* — Robert E. Bushnell, Esq.

(57) ABSTRACT

A protection circuit board for a secondary battery includes: a printed circuit board; a protection circuit attached to the printed circuit board and electrically connected thereto; a conducting pad electrically connected to a conducting pad of the protection circuit; a charging/discharging terminal electrically connected to the protection circuit and the conducting pad; a lead plate electrically connected to the conducting pad, the lead plate including at least one soldering hole arranged on a surface thereof to couple the lead plate to the conducting pad.

15 Claims, 6 Drawing Sheets

PROTECTION CIRCUIT BOARD FOR SECONDARY BATTERY AND SECONDARY BATTERY USING THE PROTECTION CIRCUIT BOARD

CLAIM OF PRIORITY

This application makes reference to, incorporates the same herein, and claims all benefits accruing under 35 U.S.C §119 from an application for PROTECTION CIRCUIT BOARD FOR SECONDARY BATTERY AND SECONDARY BATTERY USING THE SAME earlier field in the Korean Intellectual Property Office on the Sep. 28, 2007 and there duly assigned Serial No. 10-2007-0097983.

BACKGROUND OF THE INVENTION

1. Field of the Invention

The present invention relates to a secondary battery, and more particularly, the present invention relates to a structure of a cathode/anode lead plate attached to a protection circuit board for a secondary battery.

2. Description of the Related Art

Recently, compact and lightweight portable electronic devices, such as cellular phones, portable computers and camcorders, etc., have been actively developed and produced. The portable electronic devices include a built-in battery pack so as to be operated at locations where power is not available. A secondary battery that can be charged and discharged is used as the battery pack for economical reasons. Typical secondary batteries include nickel-cadmium (Ni—Cd) batteries, nickel-hydrogen (Ni—MH) batteries, lithium (Li) batteries and lithium ion (Li-ion) secondary batteries, etc. Especially, lithium ion secondary batteries have operating voltages that are three times that of nickel-cadmium (Ni—Cd) batteries or nickel-hydrogen (Ni—MH) batteries that are usually used to supply power to portable electronic devices. In addition, lithium ion secondary batteries have been widely used because they have a higher energy density per unit weight as compared with other types of batteries.

Lithium ion secondary batteries use lithium group oxides as active cathode materials, and carbon materials as active anode materials. Generally, lithium secondary batteries are divided into liquid electrolyte batteries and polymer electrolyte batteries, depending on their electrolyte. A lithium ion battery uses a liquid electrolyte, and a lithium polymer battery uses a polymer electrolyte. Lithium secondary batteries have been fabricated in various shapes, such cylinder shaped, angled shaped and pouch shaped, etc.

Generally, in a fabrication process of a secondary battery, an electrode assembly is formed by laminating a cathode plate where the cathode active material is coated on a cathode collector and a cathode tap is connected, an anode plate where the anode active material is coated on an anode collector and an anode tap is connected, and a separator and winding them. The electrode assembly is put into a can type case for the secondary battery. Then, a bare cell is fabricated by injecting the electrolyte and sealing the can type case with a cap assembly. The bare cell is electrically coupled to a protection circuit board, and the bare cell and the protection circuit board are put into a mold and melded by melted resin, and thus, a resin molding type secondary battery is completed.

The protection circuit board and the bare cell are electrically connected by a lead plate. The protection circuit board is formed with a conducting pad which is connected to the lead plate. The conducting pad and the lead plate are soldered together.

But, when connecting the conducting pad to the lead plate, the solder is melted so that the solder flows, and the solder may not solidify so as to be flat. Moreover, due to the shape of the conducting pad and the lead plate, a spread of the solder may be insufficient. In this case, the protection circuit board is connected to the bare cell at an angle, resulting in many problems.

For example, when the protection circuit and bare cell are connected at an angle, a next molding process results in a terminal of the protection circuit board being at an angle. If the terminal of the protection circuit board is inclined to one side, a space is formed by the inclined protection circuit board, allowing melted resin to penetrate into the space, resulting in a flash being formed. If the flash covers a surface of the terminal, the terminal can not be electrically connected to the electric device.

Moreover, a lead plate connected to the conducting pad often has a rectangular shape, so that a combined force of the conducting pad and lead plate is weak. Accordingly, the lead plate and conducting pad may be separated from each other due to the weak combined force.

SUMMARY OF THE INVENTION

An object of the present invention is to provide a protection circuit board for a secondary battery that can improve the flatness and spread of solder formed between a conducting pad and lead plate.

Another object of the present invention is to provide a protection circuit board for a secondary battery that can place the protection circuit board combined with a bare cell in the correct position.

Still another object of the present invention is to provide a protection circuit board for a secondary battery that can prevent inclining a lead plate to the protection circuit board to prevent the growth of flashes.

Still another object of the present invention is to provide a protection circuit board for a secondary battery that can improve combined force of cathode/anode lead plates combined with a mounting region of a protection circuit board by soldering.

Additional advantages, objects and features of the present invention are set forth in part in the description which follows and in part will become apparent to those having ordinary skill in the art upon examination of the following or may be learned from practice of the present invention.

According to one aspect of the present invention, a protection circuit board for a secondary battery is provided, the protection circuit board including: a printed circuit board; a protection circuit attached to the printed circuit board and electrically connected thereto; a conducting pad electrically connected to the protection circuit; a charging/discharging terminal electrically connected to the protection circuit and the conducting pad; a lead plate electrically connected to the conducting pad and including at least one soldering hole arranged on a surface thereof to couple the lead plate to the conducting pad. The cathode/anode lead plate may be bent by a right angle more than once, and the at least one soldering hole may be formed on one surface of the bent lead plate.

The conducting pad may have a larger area than the bent surface of the lead plate including the at least one soldering hole.

The conducting pad may be formed to have rectangular shape.

The at least one soldering hole may be formed to be orthogonal to a wide surface of the cathode/anode lead plate.

A corner of the at least one soldering hole may be rounded.

The at least one soldering hole may be formed so as to face both side surfaces of the lead plate.

A lead flowing groove may be further formed so as to connect the soldering holes facing the lead flowing groove on the lead plate.

A second soldering hole may be further formed on a central part of a surface provided with the at least one soldering hole.

The lead flowing groove may be further formed so as to connect the soldering holes facing the lead flowing groove on the lead plate, and a second soldering hole may be further formed on a central part of the surface provided with the at least one soldering hole.

The at least one soldering hole may be formed on a peripheral portion of corners of both side surfaces of the lead plate so that at least two pairs of corners of both side surfaces thereof face each other.

A third soldering hole may be further formed on the central part of the surface provided with the at least one soldering hole.

The at least one soldering hole may be formed on three side surfaces of the lead plate, respectively.

A fourth soldering hole may be further included on the central part of the surface provided with the at least one soldering hole.

A surface of the at least one soldering hole may be plated with either nickel or a nickel alloy.

The cathode/anode lead plate may be formed of either nickel or a nickel alloy.

According to another aspect of the present invention, a secondary battery using the protection circuit board for the secondary battery is provided, the secondary battery including: a bare cell including an electrode assembly having a cathode plate, an anode plate and a separator laminated and wound together, a can having an opening on one end thereof to receive the electrode assembly and an electrolyte, and a cap assembly to cover the opening of the can; a protection circuit board including a protection circuit, a conducting cathode/anode pad, an inspecting terminal, a charging/discharging terminal, a cathode lead plate having one end is connected to the conducting cathode pad and having at least one soldering hole arranged on a surface connected to the conducting cathode pad, and an anode lead plate having one end connected to the conducting anode pad and having at least one soldering hole arranged on a surface connected to the conducting anode pad and a lead assembly including a cathode lead tap electrically connected to the bare cell and including an anode lead tap electrically connected to the bare cell.

The protection circuit board, the cathode/anode lead tap, and the lead plate of cathode/anode may be molded by melted resin to form a resin molding portion, and surfaces of the charging/discharging terminal and the inspecting terminal of the protection circuit board may be exposed.

BRIEF DESCRIPTION OF THE DRAWINGS

The above and other objects, features and advantages of the present invention will be more apparent from the following detailed description taken in conjunction with the accompanying drawings, in which:

FIG. 1b is an exploded perspective view of exploded cathode/anode lead plates of the reverse side of the protection circuit board of FIG. 1a;

DETAILED DESCRIPTION OF THE INVENTION

Figure 1A:
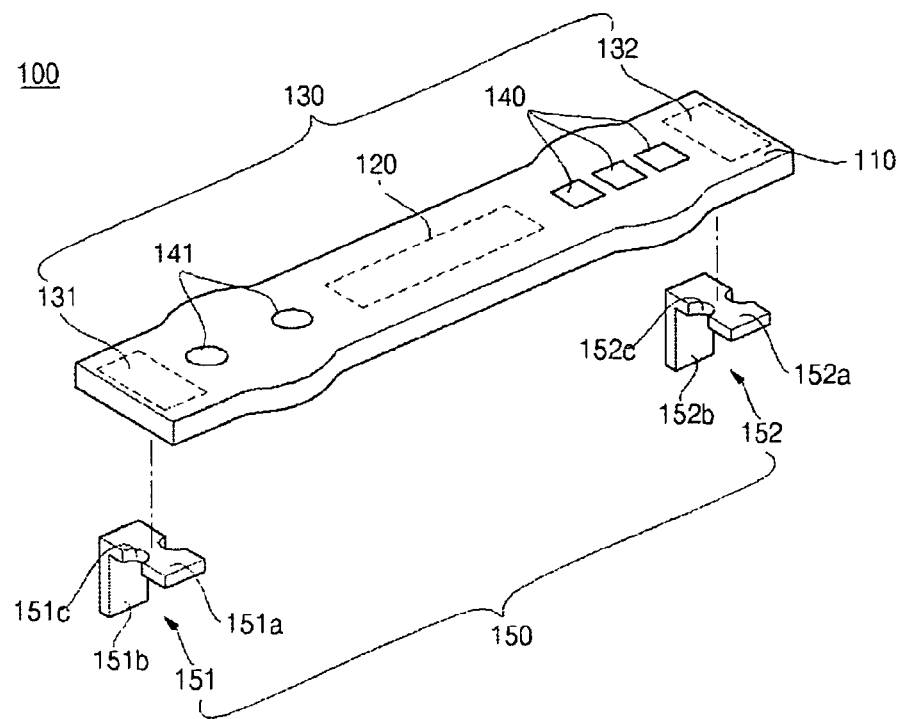
FIG. 1a is an exploded perspective view of a protection circuit board for a secondary battery according to one exemplary embodiment of the present invention.

Hereinafter, exemplary embodiments of the present invention are described in detail with reference to the accompanying drawings. The aspects and features of the present invention and methods for achieving the aspects and features will be apparent by referring to the embodiments described in detail with reference to the accompanying drawings. However, the present invention is not limited to the embodiments disclosed hereinafter, but can be implemented in diverse forms. The matters defined in the description, such as the detailed construction and elements, are merely specific details provided to assist those of ordinary skill in the art in a comprehensive understanding of the present invention, and the present invention is only defined within the scope of the appended claims. In the entire description of the present invention, the same drawing reference numerals are used for the same elements across various figures. Also, the same elements across various figures are not described again in detail for the sake of brevity.

Figure 1B:
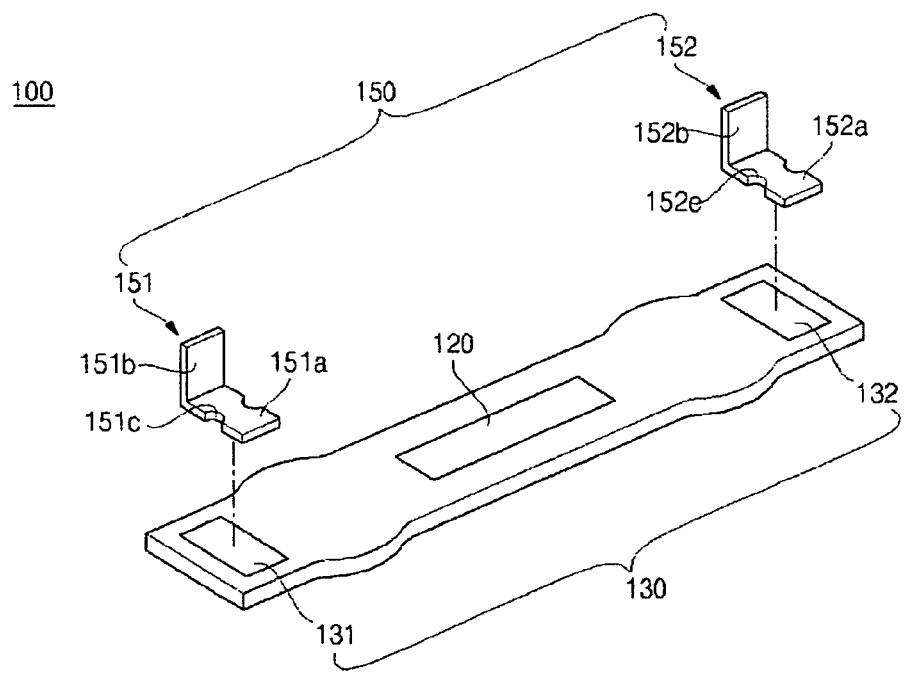
Figure 1C:
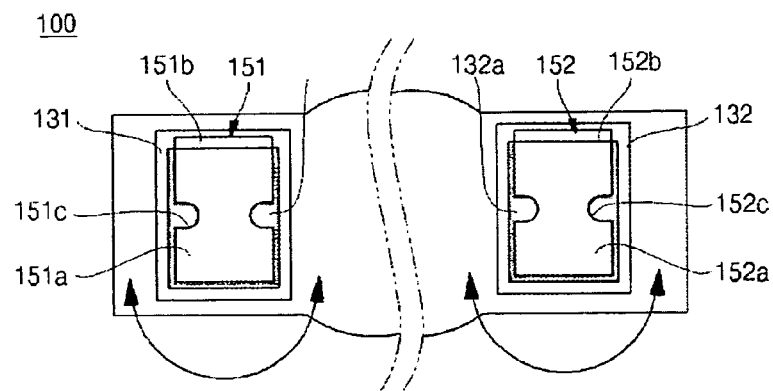
FIG. 1c is a partial plane view of the cathode/anode lead plate coupled to a connecting part of the cathode/anode lead plate of the protection circuit board of FIG. 1b.

FIG. 1a is an exploded perspective view of a protection circuit board for a secondary battery according to one exemplary embodiment of the present invention. FIG. 1b is an exploded perspective view of exploded cathode/anode lead plates of the reverse side of the protection circuit board of FIG. 1a. FIG. 1c is a partial plane view of the cathode/anode lead plate coupled to a connecting part of the cathode/anode lead plate of the protection circuit board of FIG. 1b.

As shown in FIGS. 1a to 1c, a protection circuit board 100 for a secondary battery includes a printed circuit board 110, a protection circuit 120, a conducting pad 130, a charging/discharging terminal 140 and lead plates 150.

The printed circuit board 110 is formed by an insulating board made of an epoxy or a Bakelite resin and a printed circuit pattern formed by a conductive thin film arranged on the insulating board.

The protection circuit 120 may include a passive element (not shown), an active element (not shown) and a protection circuit element (not shown), and may be electrically soldered to a printed circuit pattern (not shown) formed on an upper surface of the printed circuit board 110. The protection circuit is electrically connected to the passive element and the active element so as to manage all conditions of the secondary battery, check remaining capacity of the secondary battery or charge/discharge by selecting a suitable charging method according to the conditions of the secondary battery. The protection circuit also stores information about a voltage, an electric current, a temperature and the remaining capacity of the secondary battery, and sends the information via communication with external devices. The protection circuit may be formed by an integrated circuit by integrating a plurality of logic elements and active/passive elements.

The conducting pad 130 may be formed of a conductive material, such as a copper film, on both ends of the printed circuit board 110, and electrically connected to the printing circuit pattern. The conducting pad 130 may include a cathode conducting pad 131 electrically connected to the cathode of the battery and the anode conducting pad 132 electrically connected to an anode of the battery.

The charging/discharging terminal 140 is electrically connected to the printed circuit pattern, and electrically connected to the active element functioning as a charging/discharging switch, i.e., a field effect transistor or a transistor so as to provide an electrical path so that the secondary battery can be charged and discharged by the protection circuit having a function of charging/discharging management. Moreover, the printed circuit board 110 includes an inspection terminal 141. The inspection terminal 141 is electrically connected to the printing circuit pattern so as to provide an electrical path that can be used to determine if the charging/discharging function of the protection circuit is operating under normal conditions.

One end of each of the lead plates 150 is respectively connected to the conducting pads 131 and 132, and one or more soldering holes 151c and 152c may be formed on a surface of each of the lead plates 150 respectively connected to the conducting pads 131 and 132. Each of the lead plates 150 includes a cathode lead plate 151 connected to the cathode of the battery and an anode lead plate 152 connected to the anode of the battery. After coating melted solder on the conducting pads 131 and 132 using a Solder Mask Defined (SMD) device, the lead plates 151 and 152 provided with the soldering holes 151c and 152c are connected to the solidified solder by a reflowing process. Then, when heating the solder which has solidified in peripheral portion of the soldering holes 151c and 152c, the solder is melted and flows into the soldering holes 151c and 152c, thereby strengthening the adhesion between the lead plates 151 and 152, and the conducting pads 131 and 132.

The lead plates 151 and 152 are bent so as to provide a surface 151a where the lead plates 151 and 152 forming the soldering holes 151c and 152c are attached to the conducting pad 131 and 132, and the soldering holes 151c and 152c are formed on the surface attached to the lead plates 151 and 152. The bent lead plates 151 and 152 provide a surface 152b which is formed orthogonally to the surface 151a. However, the lead plates 151 and 152 may be bent more than once without being limited to the shapes shown in the drawing figures. Accordingly, the lead plates 151 and 152 may have various shapes so as to be easily combined with other components.

As shown in FIG. 1C, the conducting pad 131 and 132 attached to the surface of the lead plates 151 and 152 provided with the soldering holes 151c and 152c may be formed to have a larger area than the surface of the lead plates 151 and 152 provided with the soldering holes 151c and 152c. A space margin corresponding to an assembly error may be obtained by forming the conducting pads 131 and 132 wider than the surface of the lead plates 151 and 152 provided with the soldering holes 151c and 152c attached to the conducting pad 131 and 132. If solder is formed on a side surface of the lead plates 151 and 152 attached to the soldering holes 151c and 152c, and the soldering holes 151c and 152c of the lead plates 151 and 152 attached to a wide surface of the conducting pads 131 and 132 by soldering, the adhesion between the lead plates 151 and 152 and the conducting pad 131 and 132 may be improved.

The conducting pads 131 and 132 may be formed to have a rectangular shape. After the lead plates 151 and 152 provided with the soldering holes 151c and 152c are attached to the rectangular conducting pads 131 and 132, the solder 131a and 132a flows into the soldering holes 151c and 152c. The conducting pads 131 and 132 are formed to have a rectangular shape so as to provide a right position such that the solder 131a and 132a flows into the soldering holes 131c and 132c and can pool.

The soldering holes 151c and 152c may formed of a plurality of grooves so as to be orthogonal to the wide surface of the lead plates 151 and 152. The soldering holes 151c and 152c may form a plurality of grooves in the soldering holes 151c and 152c by press machining or cutting machining. The press machining or the cutting machining has an advantage in that the grooves can be formed at one time by moving a punching head (not shown) or a drill blade (not shown) orthogonally on the wide surface of the lead plates 151 and 152.

Corners of the soldering holes 151c and 152c may be rounded. After the lead plates 151 and 152 are attached to the conducting pads 131 and 132, solder is applied by the SMD device. If the corners of the soldering holes 151c and 152c are rounded, melted solder can flow well into the rounded surface of soldering holes 151c and 152c, thereby allowing the solder to be well adhered to the soldering holes 151c and 152c.

The soldering holes 151c and 152c may formed so as to face both side surfaces of the lead plates 151 and 152. When a twisting force is applied in direction of the arrow shown in FIG. 1a, the soldering holes 151c and 152c may exert the maximum combined force against the twisting force.

Figure 2:
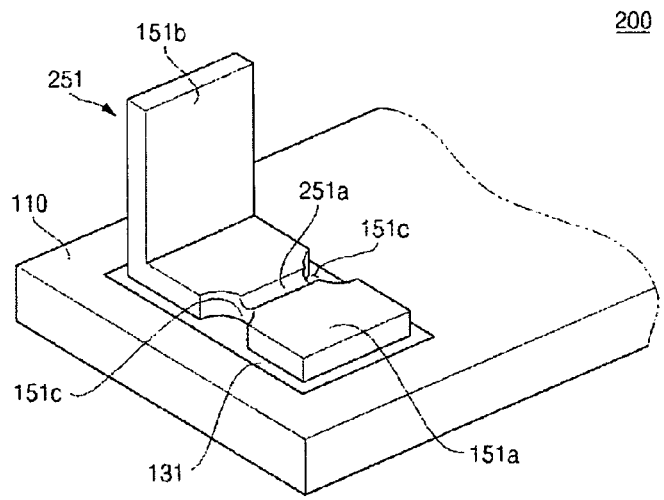
FIG. 2 is a partial perspective view of a protection circuit board according to another exemplary embodiment of the present invention.

FIG. 2 is a partial perspective view of a protection circuit board according to another exemplary embodiment of the present invention.

As shown in FIG. 2, a lead flowing groove 251a may be further formed so as to connect the soldering hole 151c to the soldering hole 151c formed to face each other on the lead plates 251. If the lead is formed on the soldering holes 151c facing the lead flowing groove 251a, the adhesion between the lead plates 251 and the conducting pad 131 is improved.

Figure 3:
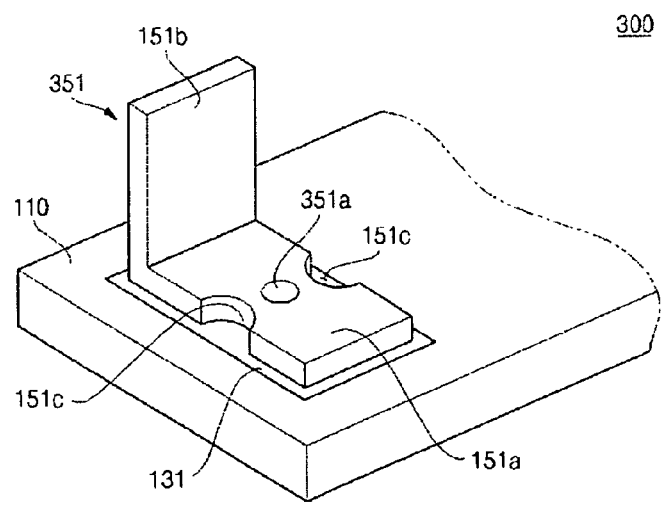
FIG. 3 is a partial perspective view of a protection circuit board according to still another exemplary embodiment of the present invention.

FIG. 3 is a partial perspective view of a protection circuit board according to still another exemplary embodiment of the present invention.

As shown in FIG. 3, a lead plate 351 of a protection circuit board 300 for a secondary battery according to still another exemplary embodiment of the present invention is formed with one or more second soldering holes 351a. The second soldering hole 351a may be formed on a central part of a surface of lead plate 351 provided with the soldering holes 151c. When the lead plates 351 are soldered to the conducting pad 131, the second soldering hole 351a increases the adhesion force between the lead plate 351a and the conducting pad 131. The second soldering hole 351a may be formed to have various shapes without being limited to the illustrated shapes.

Figure 4:
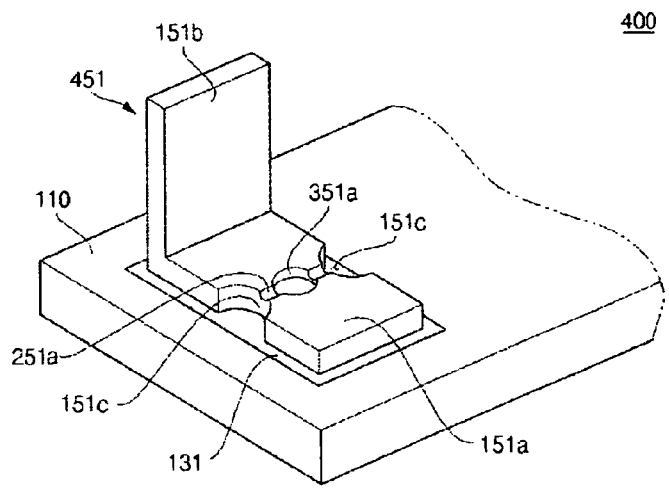
FIG. 4 is a partial perspective view of a protection circuit board according to still another exemplary embodiment of the present invention.

FIG. 4 is a partial perspective view of a protection circuit board according to still another exemplary embodiment of the present invention.

As shown in FIG. 4, a lead plate 451 of a protection circuit board 400 for a secondary battery according to still another exemplary embodiment of the present invention is formed with a flowing groove 251a so as to connect the soldering hole 151c to the soldering hole 151c formed to face each other, and a second soldering hole 351a is further formed on the central part of the lead flowing groove 251a, and thus, the lead plates 421 and the conducting pad 131 may be more strongly joined together.

Figure 5:
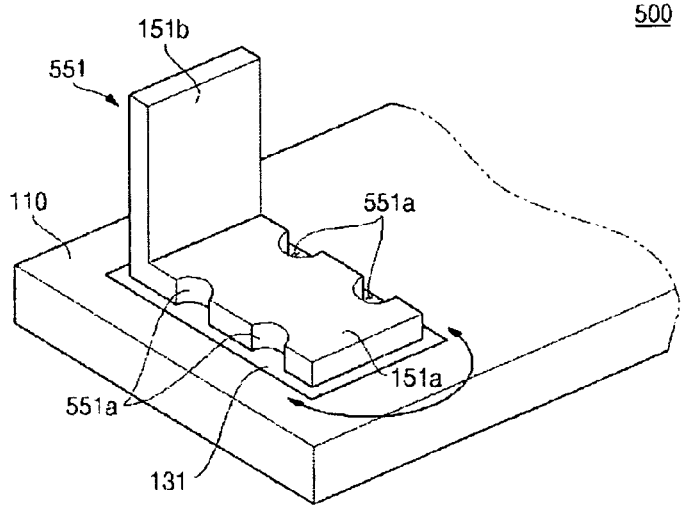
FIG. 5 is a partial perspective view of a protection circuit board according to still another exemplary embodiment of the present invention.

FIG. 5 is a partial perspective view of a protection circuit board according to still another exemplary embodiment of the present invention.

As shown in FIG. 5, a lead plate 551 of a protection circuit board 500 for a secondary battery according to still another exemplary embodiment of the present invention is formed with soldering holes 551a formed on a peripheral portion of corners of both side surfaces of the lead plates 551, so that at least two pairs of soldering holes face each other. If the lead plates 551 are soldered to the conducting pad 131 and a plurality of soldering holes 551a formed on the peripheral portion of corners so as to face each other are, a strong binding force against a twisting force applied in a direction of the arrow mark of FIG. 5 is exerted, and the twisting of the lead plates 551 in a direction orthogonal to the direction of the arrow may be further prevented.

Figure 6:
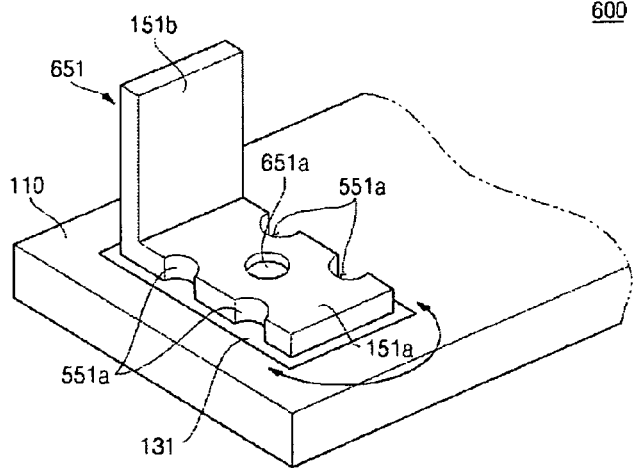
FIG. 6 is a partial perspective view of a protection circuit board according to still another exemplary embodiment of the present invention.

FIG. 6 is a partial perspective view of a protection circuit board according to still another exemplary embodiment of the present invention.

As shown in FIG. 6, a lead plate 651 of a protection circuit board 600 for a secondary battery according to still another exemplary embodiment of the present invention is formed with a third soldering hole 651a additionally formed on the central part of the surface provided with the soldering holes 551a, and thus, the lead plates 651 and the conducting pad 131 may be more strongly joined together.

Figure 7:
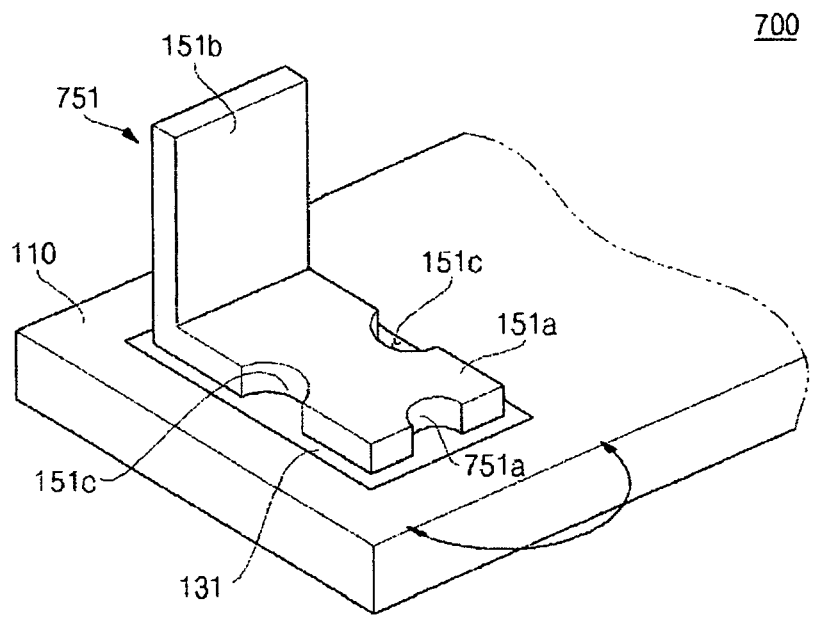
FIG. 7 is a partial perspective view of a protection circuit board according to still another exemplary embodiment of the present invention.

FIG. 7 is a partial perspective view of a protection circuit board according to still another exemplary embodiment of the present invention.

As shown in FIG. 7, a lead plate 751 of a protection circuit board 700 for a secondary battery according to still another exemplary embodiment of the present invention is formed with soldering holes 151c and 751a formed on respective three side surfaces of the lead plates 751, so that a strong binding force against twisting applied in the direction of the arrow of FIG. 7 may be exerted, and the twisting of the lead plates 751 in a direction orthogonal to the direction of the arrow may be further prevented. One or more soldering holes 751a may be formed on the respective three side surfaces of the lead plates 751, thereby increasing the adhesion force.

Figure 8:
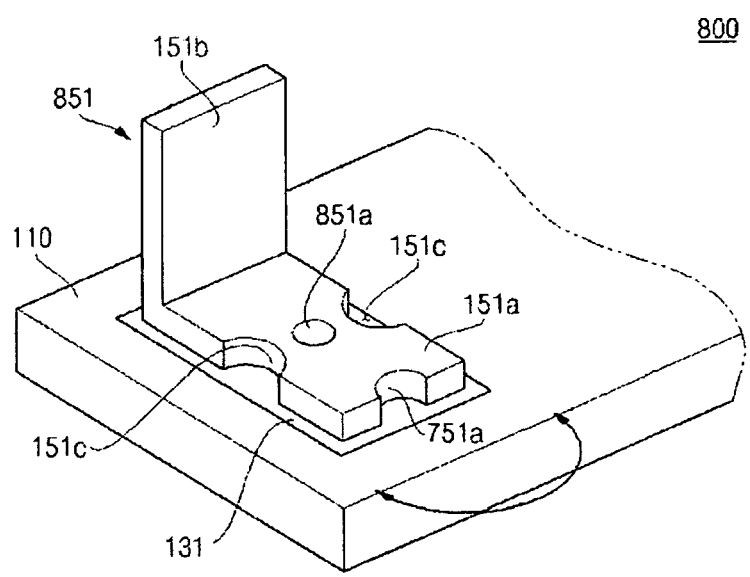
FIG. 8 is a partial perspective view of a protection circuit board according to still another exemplary embodiment of the present invention.

FIG. 8 is a partial perspective view of a protection circuit board according to still another exemplary embodiment of the present invention.

As shown in FIG. 8, a lead plate 851 of a protection circuit board 800 for a secondary battery according to still another exemplary embodiment of the present invention is formed with a fourth soldering hole 851a formed on the central part of the surface provided with the soldering holes 151c and 751a, and thus, the lead plates 851 and the conducting pad 131 may be more strongly joined together.

The surfaces of the soldering holes 151c and 751a may be plated by either nickel or a nickel alloy. Nickel has good conductivity and lead adheres well to it, so that the lead plates 851 and the conducting pad 131 may be more strongly joined together.

The lead plates 851 may be formed of either nickel or a nickel alloy. The fabrication process may be reduced by using the lead plates formed of nickel or a nickel alloy without plating nickel on the surface of the soldering holes.

Figure 9:
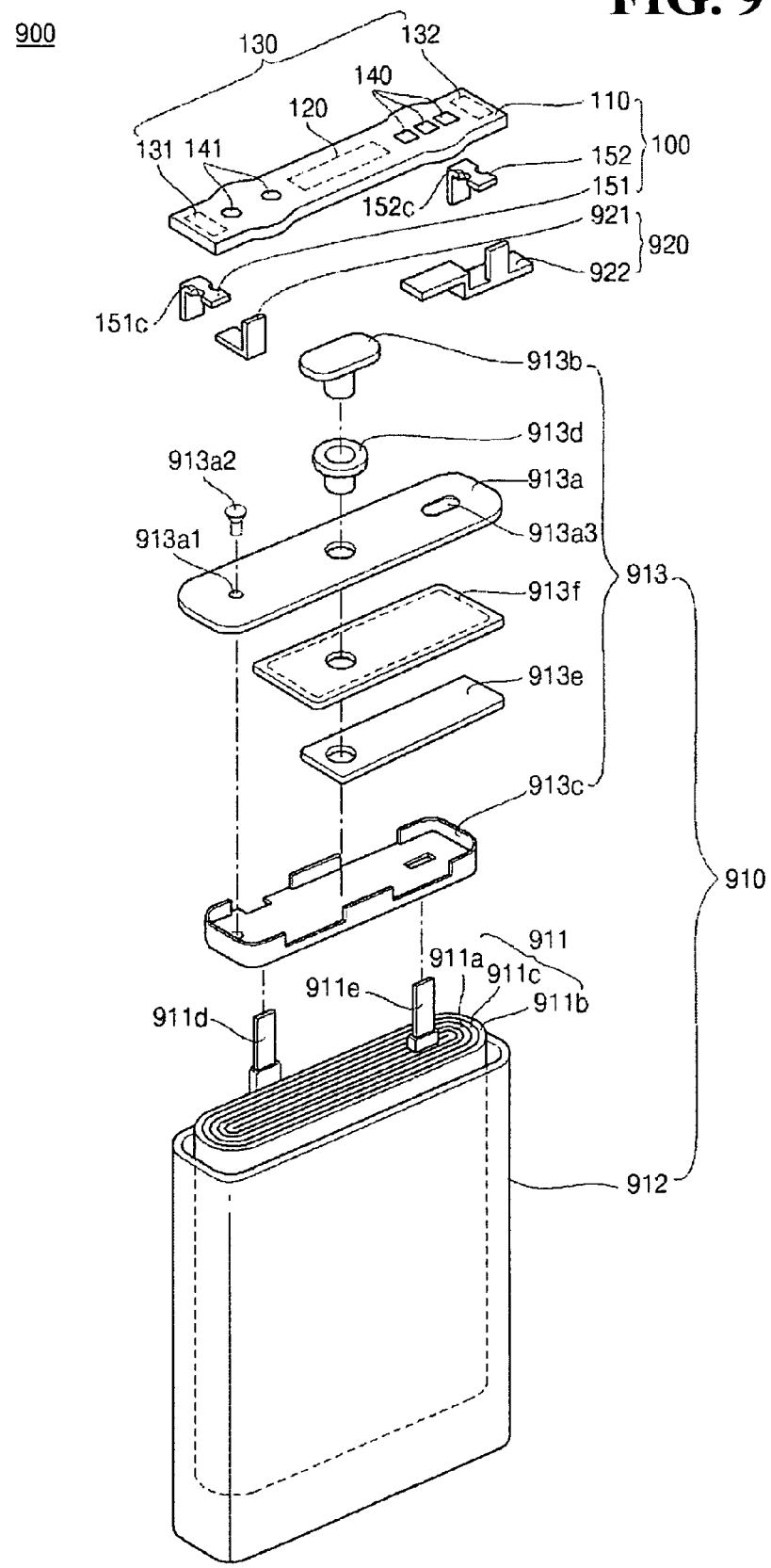
FIG. 9 is a exploded view of a secondary battery according to one exemplary embodiment of the present invention; and, FIG. 10 is a perspective view of a secondary battery according to another exemplary embodiment of the present invention.

FIG. 9 is a exploded view of a secondary battery according to one exemplary embodiment of the present invention.

As shown in FIG. 9, a secondary battery 900 using the protection circuit board for the secondary battery includes a protection circuit board 100, a bare cell 910, and a lead assembly 920.

The protection circuit board 100 has been described above and accordingly, a description thereof has not been repeated. In this exemplary embodiment, the conducting pad includes a cathode conducting pad and anode conducting pad.

The bare cell 910 includes an electrode assembly 911, a can 912 have an opening on one end thereof so as to receive the electrode assembly 911 and an electrolyte, and a cap assembly 913 to cover the opening of the can, and electrically coupled to the electrode assembly 911 and the can 912.

The electrode assembly 911 is formed by laminating a cathode plate 911a where a cathode tap 911d is coupled, an anode plate 911b where an anode tap 911e is coupled, and a separator 911c and winding them together.

The cathode plate 911a includes a cathode collector and a cathode active material layer. The cathode active material layer may include a compound containing lithium, a binder for improving the adhesion force, and a conductive material for improving its electrical conductivity. The cathode collector is generally made of aluminum, provides a transfer passage of charges generated by the cathode active material layer, and supports the cathode active material layer. The cathode active material layer is attached on a wide surface of the cathode collector. An uncoated cathode portion (not shown) that is not provided with the cathode active material layer is formed on one side end of the cathode plate, and the cathode tap 911d is attached to the uncoated cathode portion.

The anode plate 911b includes an anode collector and an anode active material layer. The anode active material layer may include hard carbon, which is generally used, or graphite and a binder for improving the adhesion force among active material particles. The anode collector is generally made of copper, provides a transfer passage of charges generated by the anode active material layer, and supports the anode active material layer. The anode active material layer is attached on a wide surface of the anode plate 911b. An uncoated anode portion (not shown) not provided with the anode active material layer is formed on one side end of the anode plate 911b, and the anode tap 911e is attached to the uncoated anode portion.

The separator 911c is interposed between the cathode plate 912a and the anode plate 911b so as to insulate the cathode plate 912a and the anode plate 911b and pass through charges of the cathode plate 912a and the anode plate 911b. Generally, the separator 911c is made of polyethylene (PE) or polypropylene (PP). However, the present invention is not limited thereto. The separator 911c may include an electrolyte, and consist of a liquid phase or gel form.

The can 912 receives the electrode assembly 911 and the electrolyte, and may be formed to have an opening on one end thereof. The can 912 may be formed in an angled type or a track type, depending on the shape of the electrode assembly 911. The can 912 receiving the electrode assembly 911 is sealed with the cap plate 913a of the cap assembly 913 by a method, such as welding, etc. after the can 912 receives an insulating case 913c on an upper part of the electrode assembly 911. The can 912 is usually made of aluminum. However, the present invention is not limited thereto.

The cap assembly 913 further includes the insulating case 913c mounted on an upper part of the electrode assembly 911 received in the inside of the can 912 so as to insulate the upper part of the electrode assembly 911, an electrode terminal 913b, an insulating gasket 913d insulating the cap plate 913a and the electrode terminal 913b, a terminal plate 913e providing the central hole fixed on the cap plate 913a by pressing an end of the electrode terminal 913b, and an insulating plate 913f insulating the cap plate 913a and the terminal plate 913e. The insulating gasket 913d and the insulating plate 913f may be formed of insulating material, such as polyethylene (PE) or polypropylene (PP). The electrode terminal 913b, the terminal plate 913e and the cap plate 913a may be formed of a conductive metal, such as nickel, a nickel alloy, aluminum or an aluminum alloy. However, the present invention is not limited thereto. The cap plate 913a has a plug 913a2 to seal the electrolyte injection hole 913a1 used for injecting the electrolyte. A safety vent 913a may be further formed on the upper surface of the cap plate 913a so as to prevent an explosion of the secondary battery by being opened when the pressure on the secondary battery is increased.

The lead assembly 920 includes the cathode lead tap 921 and the anode tap 922. One end of the cathode lead tap 921 may be electrically connected to the upper surface of the cap plate 913a by a method, such as welding, etc. The other end of the cathode lead tap 921 may be electrically connected to the cathode lead plate 151 by a method, such as welding or soldering, etc. One end of the anode lead tap 922 may be electrically connected to the electrode terminal 913b by a method, such as welding, etc. The other end of the anode lead tap 922 may be electrically connected to the anode lead plate 152 by a method, such as welding or soldering, etc. An insulator (not shown) may be formed between the anode lead tap 922 and the cap plate 913a so as to insulate the anode lead tap 922 and the cap plate 913a. The cathode/anode lead taps 921 and 922 may be formed to be bent so as to reduce their mounting space and simplify combining them with other components, and are formed of nickel or a nickel alloy.

The adhesion force between the protection circuit board 100 and the bare cell 910 is improved by the cathode lead plate 151 and the anode lead plate 152 whose adhesion force is strengthened by the soldering holes 151c and 152c. Also, the secondary battery 900 is correctly attached to the protection circuit board 130 by the soldering holes 151c and 152c. The cathode/anode lead tap 920 is not inclined by the soldering holes 151c and 152c.

Figure 10:
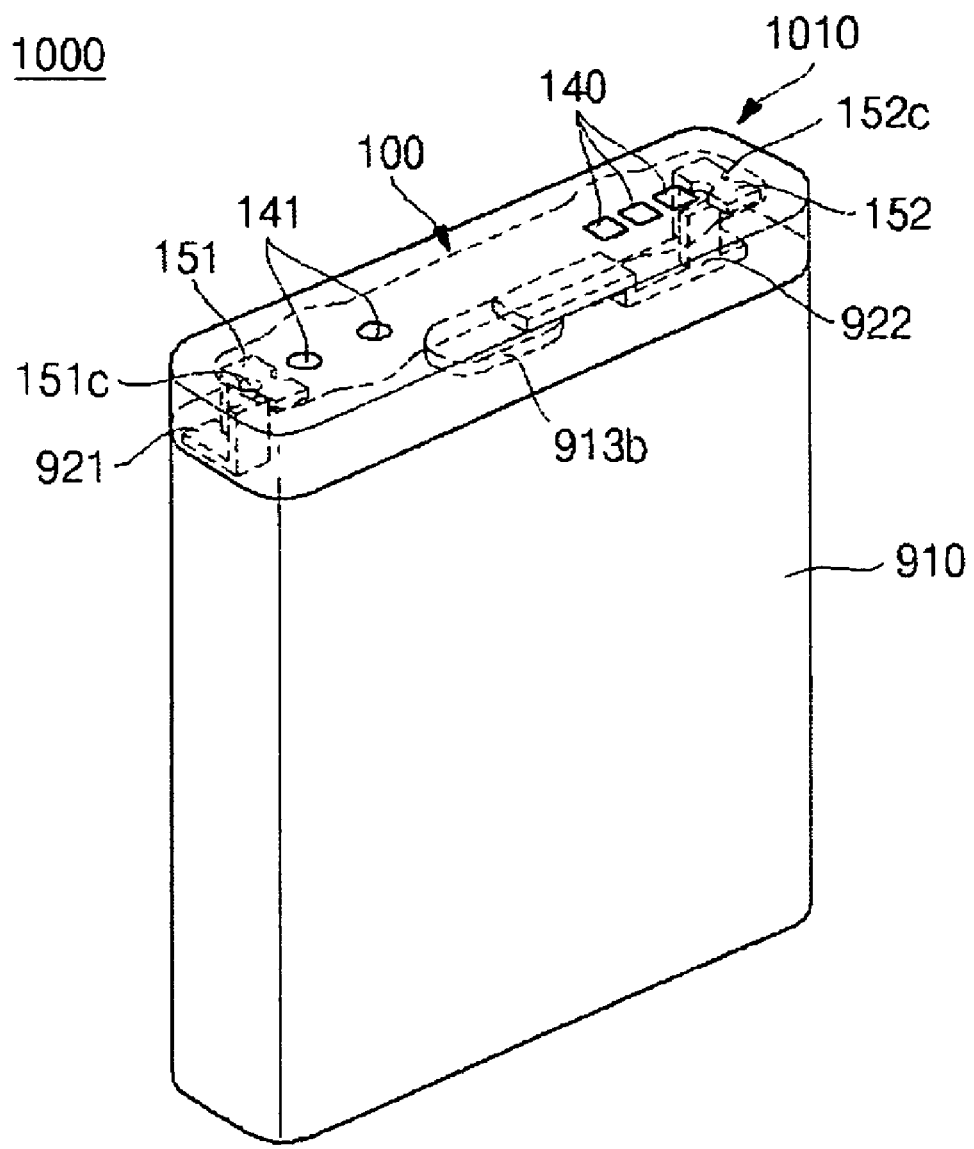

FIG. 10 is a perspective view of a secondary battery according to another exemplary embodiment of the present invention.

As shown in FIG. 10, a secondary battery 1000 according to another exemplary embodiment of the present invention include a protection circuit board 100, a bare cell 910, cathode/anode lead taps 921 and 922, cathode/anode lead plates 151 and 152, and a resin molding portion 1010. Surfaces of the charging/discharging terminal 140 and the inspecting terminal 141 of the protection circuit board 100 may be exposed. More specifically, the resin molding part 1010 is formed when the melted resin is solidified. In other words, the resin molding part 1010 may be formed by electrically connecting the bare cell 910, the protection circuit board 100, and the lead assembly, inserting them into a mold and molding them. The resin molding part 1010 may be formed of a Poly Carbonate (PC) resin or Acrylonitryl Butadiene Styrene (ABS) resin. However, the present invention is not limited thereto. In the resin molding portion 1010, the charging/discharging terminal 140 formed on the protection circuit board 100 should not be covered by the melted resin so as to be exposed, and the inspecting terminal 141 may be exposed to contact a portable electric device. When the resin molding portion 1010 is coupled to a charger/discharger (not shown) or other external devices (not shown), it functions as a fixing frame. Accordingly, the cathode/anode lead plates 151 and 152 are attached to the protection circuit board 100 by the soldering holes 151c and 152c so as not to be twisted so that surfaces of the charging/discharging terminal 140 and the inspecting terminal 141 are arranged on a designed position and exposed. If the cathode/anode lead plates 151 and 152 are twisted, surfaces of the charging/discharging terminal 140 and the inspecting terminal 141 may be not exposed but may be covered with the melted resin in the molding process.

The protection circuit board for a secondary battery and a secondary battery using the protection circuit board according the present invention can improve the adhesion force between the mounting region of the protection circuit board and the conducting pad by changing the combined structure of the lead plate and the conducting pad of the protection circuit board and soldering them together.

The protection circuit board for the secondary battery and the secondary battery using the protection circuit board according the present invention can improve a flatness and spread of solder formed between a conducting pad and the lead plate.

The protection circuit board for the secondary battery and the secondary battery using the protection circuit board can place the protection circuit board attached to a bare cell in the correct position.

The protection circuit board for the secondary battery and the secondary battery using the protection circuit board can prevent inclining a lead plate to the protection circuit board to prevent a growth of flash.

It should be understood by those of ordinary skill in the art that various replacements, modifications and changes in the form and details may be made therein without departing from the spirit and scope of the present invention as defined by the following claims. Therefore, it is to be appreciated that the above described embodiments are for purposes of illustration only and are not to be construed as being limitations of the present invention.

What is claimed is:
1. A secondary battery comprising
a protection circuit board for a secondary battery, the protection circuit board comprising:
a printed circuit board;
a protection circuit attached to the printed circuit board and electrically connected thereto;
a conducting pad electrically connected to the protection circuit;
a charging/discharging terminal electrically connected to the protection circuit and the conducting pad; and
a lead plate electrically connected to the conducting pad, the lead plate including two soldering holes arranged on opposite sides of a surface of the lead plate, the two soldering holes are connected by a lead flow groove and the lead plate is coupled to the conducting pad via the two soldering holes, said lead flow groove is an indentation in the surface of the lead plate and the two soldering holes are half circle shaped and pass entirely through the lead plate.

2. The secondary battery of claim 1, wherein the lead plate has been bent at least once, and one bent surface of the lead plate including the at least one soldering hole is coupled to the conducting pad.

3. The secondary battery of claim 2, wherein the conducting pad has a larger area than the bent surface of the lead plate including the at least one soldering hole.

4. The secondary battery of claim 2, wherein the conducting pad has a rectangular shape.

5. The secondary battery of claim 2, wherein the at least one soldering hole of said two soldering holes is orthogonal to a wide surface of the lead plate.

6. The secondary battery of claim 1, further comprising a full circle shaped soldering hole arranged on a central part of a surface having the at least one soldering hole.

7. The secondary battery of claim 2, further comprising: full circle shaped is arranged on a central part of the lead flowing groove.

8. The secondary battery of claim 2, wherein the at least one soldering hole is arranged on a peripheral portion of a respective corner of both side surfaces of the lead plate so that at least two pairs of corners of both side surfaces thereof face each other.

9. The secondary battery of claim 8, further comprising at least one third soldering hole arranged on a central part of the surface including the two soldering hole.

10. The secondary battery of claim 2, wherein the soldering are arranged on three respective side surfaces of the lead plate.

11. The secondary battery of claim 10, further comprising a fourth soldering hole arranged on a central portion of the surface.

12. The secondary battery of claim 1, wherein a surface of the at least one soldering hole is plated by either nickel or a nickel alloy.

13. The secondary battery of claim 1, wherein the lead plate comprises either nickel or a nickel alloy.

14. A secondary battery, comprising:
a bare cell including an electrode assembly having a cathode plate, an anode plate and a separator laminated and wound together, a can having an opening on one end thereof to receive the electrode assembly and an electrolyte, and a cap assembly to cover the opening of the can;
a protection circuit board including a protection circuit, a conducting cathode/anode pad, an inspecting terminal, a charging/discharging terminal, a cathode lead plate having one end connected to the conducting cathode pad and having at least one soldering hole arranged on a surface connected to the conducting cathode pad, and an anode lead plate having one end connected to the conducting anode pad and having two soldering holes arranged on opposite sides of a surface connected to the conducting anode pad, said two soldering holes are connected by a lead flow groove, said lead flow groove is an indentation in the surface of the lead plate and the two soldering holes are half circle shaped and pass entirely through the lead plate; and
a lead assembly including a cathode lead tap electrically connected to the bare cell and including an anode lead tap electrically connected to the bare cell.

15. The secondary battery of claim 14, wherein the protection circuit board, the cathode/anode lead tap, and the lead plate of cathode/anode have been molded by melted resin to form a resin molding portion, and wherein surfaces of the charging/discharging terminal and the inspecting terminal of the protection circuit board are exposed.

* * * * *